United States Patent
Tseng et al.

(10) Patent No.: US 8,759,943 B2
(45) Date of Patent: Jun. 24, 2014

(54) TRANSISTOR HAVING NOTCHED FIN STRUCTURE AND METHOD OF MAKING THE SAME

(75) Inventors: Chih-Hung Tseng, Zhutang Township (TW); Da-Wen Lin, Hsinchu (TW); Chien-Tai Chan, Hsinchu (TW); Chia-Pin Lin, Xinpu Township (TW); Li-Wen Weng, Zhunan Township (TW); An-Shen Chang, Jubei (TW); Chung-Cheng Wu, Ju-Bei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 102 days.

(21) Appl. No.: 12/900,626

(22) Filed: Oct. 8, 2010

(65) Prior Publication Data
US 2012/0086053 A1    Apr. 12, 2012

(51) Int. Cl.
*H01L 29/78* (2006.01)
(52) U.S. Cl.
USPC ............................................. 257/513
(58) Field of Classification Search
USPC ............................................. 257/513
See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,963,789 A * | 10/1999 | Tsuchiaki | 438/62 |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 * | 11/2003 | Fried et al. | 438/164 |
| 6,706,571 B1 | 3/2004 | Yu et al. | |
| 6,713,365 B2 | 3/2004 | Lin et al. | |
| 6,727,557 B2 | 4/2004 | Takao | |
| 6,734,063 B2 * | 5/2004 | Willer et al. | 438/257 |
| 6,740,247 B1 | 5/2004 | Han et al. | |
| 6,743,673 B2 | 6/2004 | Watanabe et al. | |
| 6,762,448 B1 | 7/2004 | Lin et al. | |

(Continued)

FOREIGN PATENT DOCUMENTS

| | | |
|---|---|---|
| CN | 1945829 | 4/2004 |
| CN | 101179046 | 5/2005 |

(Continued)

OTHER PUBLICATIONS

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

(Continued)

*Primary Examiner* — Eugene Lee
(74) *Attorney, Agent, or Firm* — Lowe Hauptman & Ham, LLP

(57) ABSTRACT

A transistor includes a notched fin covered under a shallow trench isolation layer. One or more notch may be used, the size of which may vary along a lateral direction of the fin. In some embodiments, The notch is formed using anisotropic wet etching that is selective according to silicon orientation. Example wet etchants are tetramethylammonium hydroxide (TMAH) or potassium hydroxide (KOH).

20 Claims, 8 Drawing Sheets

(56) References Cited

U.S. PATENT DOCUMENTS

| | | |
|---|---|---|
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 * | 11/2007 | Oh et al. ............. 438/283 |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 * | 8/2008 | Doyle et al. ............. 438/164 |
| 7,410,844 B2 * | 8/2008 | Li et al. ............. 438/156 |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,709,341 B2 * | 5/2010 | Fucsko et al. ............. 438/389 |
| 7,759,228 B2 | 7/2010 | Sugiyama et al. |
| 7,795,097 B2 | 9/2010 | Pas |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,915,693 B2 * | 3/2011 | Okano ............. 257/401 |
| 7,923,314 B2 * | 4/2011 | Tezuka et al. ............. 438/157 |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,039,843 B2 * | 10/2011 | Inaba ............. 257/64 |
| 8,043,920 B2 | 10/2011 | Chan et al. |
| 8,076,189 B2 | 12/2011 | Grant |
| 8,101,475 B2 | 1/2012 | Oh et al. |
| 8,241,970 B2 * | 8/2012 | Cohen et al. ............. 438/150 |
| 2003/0080361 A1 | 5/2003 | Murthy et al. |
| 2003/0109086 A1 | 6/2003 | Arao |
| 2003/0234422 A1 | 12/2003 | Wang et al. |
| 2004/0075121 A1 | 4/2004 | Yu et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0233598 A1 | 10/2005 | Jung et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0153995 A1 | 7/2006 | Narwankar et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 * | 1/2007 | Brask et al. ............. 257/67 |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 * | 4/2007 | Mathew et al. ............. 438/182 |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0231997 A1 | 10/2007 | Doyle et al. |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2007/0281488 A1 * | 12/2007 | Wells et al. ............. 438/705 |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0155790 A1 | 6/2010 | Lin et al. |
| 2010/0163926 A1 | 7/2010 | Hudait et al. |

(56) References Cited

U.S. PATENT DOCUMENTS

| | | |
|---|---|---|
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 101005035 | 7/2007 |
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Shikida, Mitsuhiro et al., "Comparison of Anisotropic Etching Properties between KOH and TMAH Solutions", Dept. of Micro System Engineering, Nagoya University, Chikusa, Nagoya, Japan, IEEE Xplore, Jun. 30, 2010, pp. 315-320.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n. d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Office Action dated May 2, 2012 from corresponding application No. CN 201010196345.0.

Office Action dated May 4, 2012 from corresponding application No. CN 201010243667.6.

\* cited by examiner

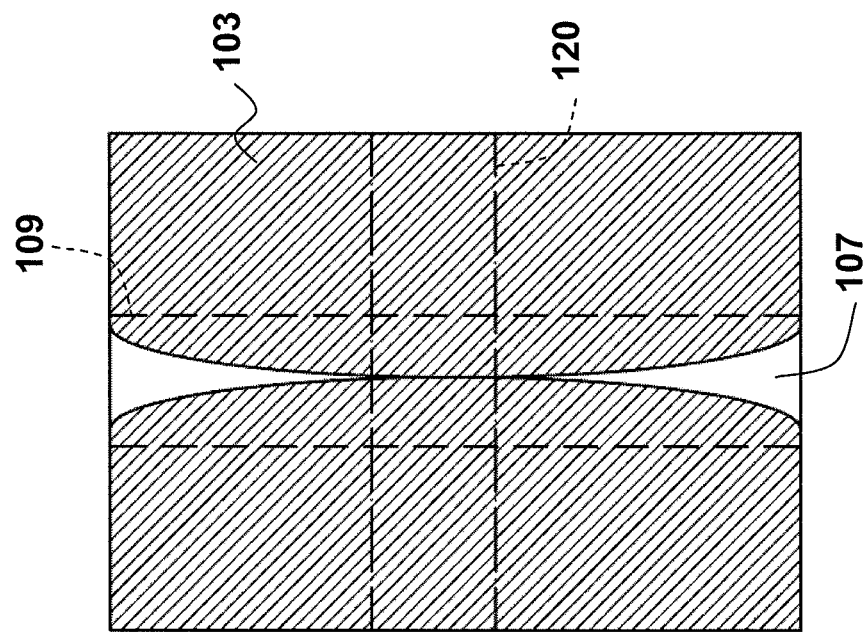
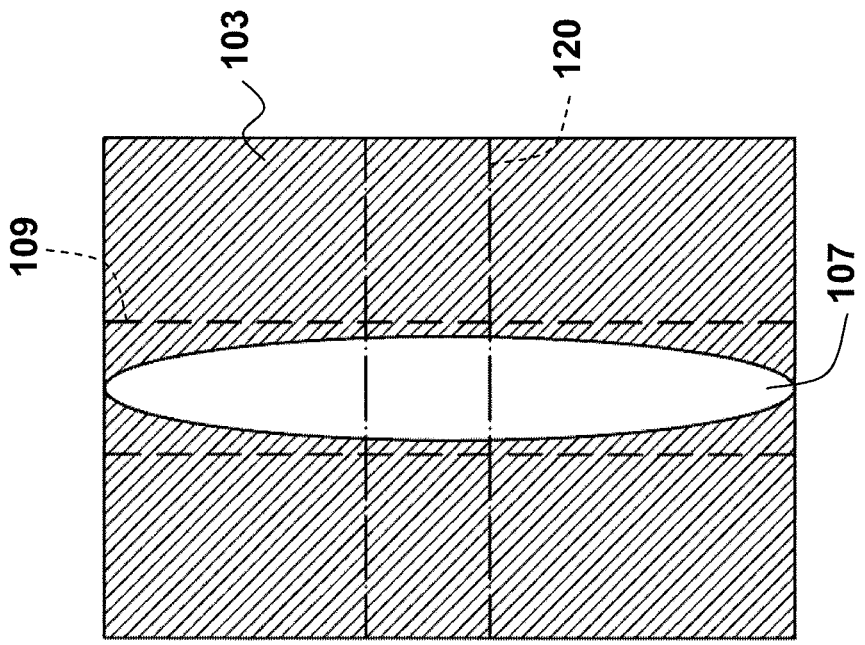

TRANSISTOR HAVING NOTCHED FIN STRUCTURE AND METHOD OF MAKING THE SAME

CROSS-REFERENCE TO RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The disclosure relates generally to integrated circuit devices, and more particularly to structure and methods for forming fin field-effect transistors (FinFETs).

BACKGROUND

In the rapidly advancing semiconductor manufacturing industry, complementary metal oxide semiconductor (CMOS) FinFET devices may be used in many logic and other applications and are integrated into various different types of semiconductor devices. FinFET devices typically include semiconductor fins with high aspect ratios in which the channel and source/drain regions for the transistor are formed. A gate is formed over and along the sides of a portion of the semiconductor fins. The increased surface area of the channel and source/drain regions in a FinFET results in faster, more reliable and better-controlled semiconductor transistor devices.

Current FinFET technology, however, has challenges. For example, the channel is usually formed from the bulk substrate and is susceptible to a channel punch-through effect at the bottom of the transistor. Channel punch-through is a condition in which the depletion layers of the source and the drain connect to each other through the substrate even at equilibrium. At low gate voltages, the punch-through current is injected through the saddle point of the intrinsic potential into the drain region by the electric field from the drain. The effect is premature breakdown of the FinFET.

As such, an improved fabrication method and structure for a FinFET device continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1D and 1E are cross-sectional views of example FinFETs taken from the reference plane A in FIG. 1C.

DETAILED DESCRIPTION

Figure 1B:
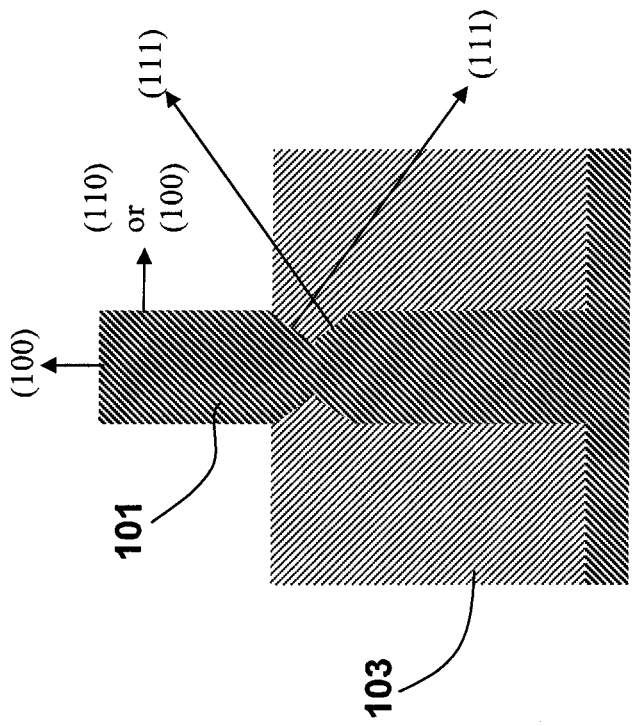
FIGS. 1A and 1B illustrate partially fabricated FinFETs in accordance with various embodiments of the present disclosure.

The making and using of illustrative embodiments are discussed in detail below. It should be appreciated, however, that the disclosure provides many applicable inventive concepts that can be embodied in a wide variety of specific contexts. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative and do not limit the scope of the invention.

Conventional FinFETs use a substantially rectangular fin structure formed generally in one of two ways. In a first method, bulk silicon on a substrate is etched into rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide. The dielectric material is usually deposited in excess to completely cover the fins and optionally the hardmask layer if not yet removed. The dielectric material is planarized down to the top surface of the fin/hardmask, and then etched to a level below the top of the fin so that a portion of the fin protrudes above the STI.

In a second method, the STI features are formed first on bulk silicon material. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or a deposited silicon such as silicon-on-insulator (SOI) with a bather oxide (BOX) layer between the SOI and the underlying silicon substrate.

Figure 1A:
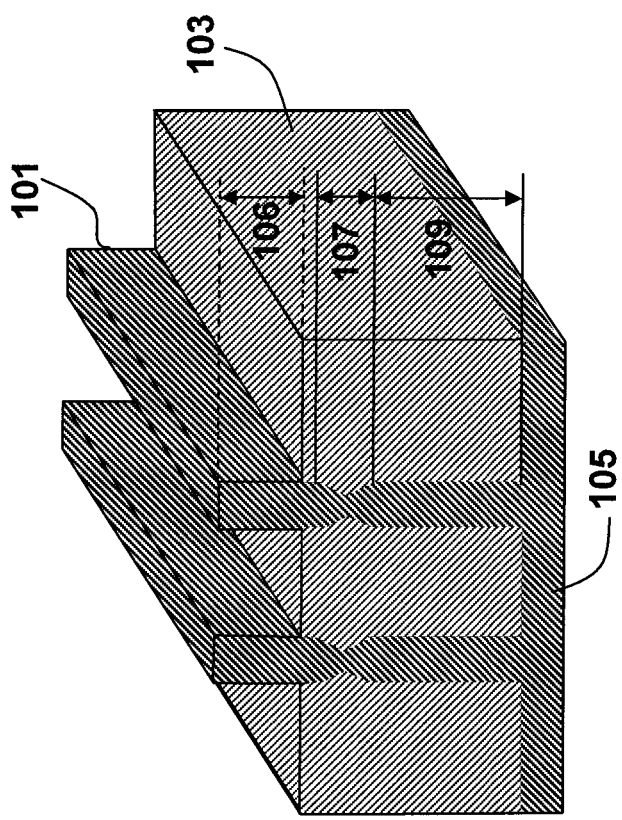
Figure 1C:
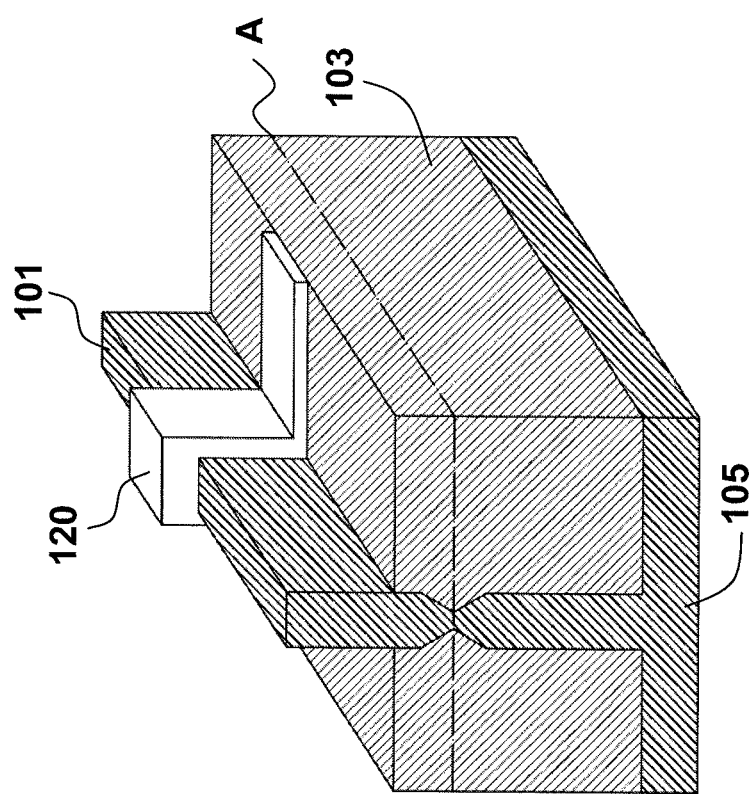
FIG. 1C is a cross-sectional view of a FinFET in accordance with one or more embodiments.

The FinFETs made from the first and the second method both are affected by the channel punch-through effect described above and can prematurely breakdown. FIGS. 1A and 1B illustrate partially fabricated FinFETs that reduce the channel punch-through effect by varying the width of the portion of the fin under the top the STI. FIG. 1A is a three-dimensional perspective view depicting two fins, and FIG. 1B is a cross sectional view of one of the fins. FIG. 1C is a cross-sectional view of a FinFET in accordance with one or more embodiments. FIGS. 1D and 1E are cross-sectional views of example FinFETs taken from the reference plane A in FIG. 1C.

Referring to FIG. 1A, the fin structure 101 includes an exposed portion 106 above the top of the STI 103, a narrowed portion 107 below the exposed portion 106, and a buried portion 109 of substantially constant thickness below the narrowed portion 107. The buried portion 109 is connected to the bulk silicon layer 105. The narrowed portion 107 has varying thickness from the top to the bottom of the narrowed portion including a narrowest portion approximately in the middle of the narrowed portion 107. Referring to FIG. 1C, a gate stack 120 is formed over a middle portion of the fin 101. Note that the narrowest portion has a narrowest width shown in a fin cross section. The term "width" as used herein refers to the dimension between opposite sidewalls of the fin measured on a plane parallel to the top surface of the substrate. The term "length" as used herein refers to the dimension along a lateral direction perpendicular to the width and parallel to the top of the substrate. The length of a fin is usually the largest dimension. In some embodiments, the narrowest width can vary along the length of the fin in different fin cross sections. For example, referring to FIGS. 1D and 1E, the cross section in the middle of the fin can have a different narrowest width than the cross sections at the ends of the fin. In any particular cross section, the narrowest width may be less than about 70% of the widest width, less than about 50% of a widest width, or less than about 30% of a widest width. In some embodiments, the narrowest width may be less than about 70% of the width at a constant width portion (exposed portion 106 or buried portion 109), less than about 50% of the width at a constant width portion, or less than about 30% of the width at a constant width portion.

Note that both the narrowed portion 107 and the buried portion 109 are entirely below a top surface of the STI 103 in the FinFET. In the embodiment shown, the narrowing occurs on both sides of the fin as lengthwise notches, or notches that extend along the length of the fin.

Other embodiments include having a notch on one side only or having two sets of notches, or having notches that result in varying fin width along the length of the fin. For example, referring to FIG. 1E, the narrowest portion of the fin may have a smallest width halfway down the length of the fin. Widths at the ends of the fin may have intermediate values between the width of the buried section and the smallest width. In some embodiments, the smallest width may be zero. In still other embodiments, the narrowing has shapes other than simply notches, depending on the method used to remove the fin material. For example, the narrowing may be in a semi-ellipsoid shape or a rectangular shape.

In the notch embodiments, the method used to remove the fin material is anisotropic wet etching that removes silicon at orientation plane dependent rates. FIG. 1B shows the orientation planes of the various surfaces of fin 101 for a substrate. A family of lattice planes is denoted by three integers l, m, and n, also known as Miller indices, written in the form of (l-m-n) in the present disclosure. Each set of indices (l-m-n) denotes a plane defined by intercepts on three axes, where the intercepts are reciprocals of l, m, and n. The substrate 105 has crystal orientation of <1-0-0>. The top surface of the fin has a (1-0-0) plane. The vertical sides of the fin can be a (1-1-0) plane or an (1-0-0) equivalent plane. The faces of the notches have (1-1-1) planes. An anisotropic wet etch using tetramethylammonium hydroxide (TMAH), potassium hydroxide (KOH) or another strong alkaline etchant (pH>12) can etch a notch into silicon because the bonding energy of silicon atoms is different for each crystal plane. These etchants therefore have high sensitivity between certain orientation planes in an etch rate limited, not diffusion limited, reaction. For example, for TMAH, the etch rate ratio of (1-1-1) to (1-0-0) is 0.027. In other words, the etch rate for orientation (1-0-0) is 37 times that of orientation (1-1-1). The etch rate ratio for (1-1-1) to (1-1-0) is even lower, at 0.015; in other words, the etch rate for orientation (1-1-0) is 68 times that of orientation (1-1-1). Thus, a TMAH wet etch results in the notch opening as shown in FIGS. 1A and 1B. The orientation dependence of KOH wet etch is similar to TMAH, but with different rates and ratios. In one example, the etchant includes TMAH and KOH with the TMAH at about 20% by weight.

Narrowing of other shapes such as a semi-ellipsoid shape or a rectangular shape can be achieved using other etching methods. For example, these shapes may be etched using isotropic silicon etching using a combination of hydrofluoric acid (HF) with a number of additives such as nitric acid ($HNO_3$), citric acid ($CH_3COOH$), sodium chlorite ($NaClO_2$), perchloric acid ($HClO_4$), fresh potassium permanganate ($KMnO_4$), or combinations of these additives. These chemical mixtures tend to uniformly remove material, and are limited by the mass transport (diffusion limited) of chemical species to the crystal surface.

Figure 2:
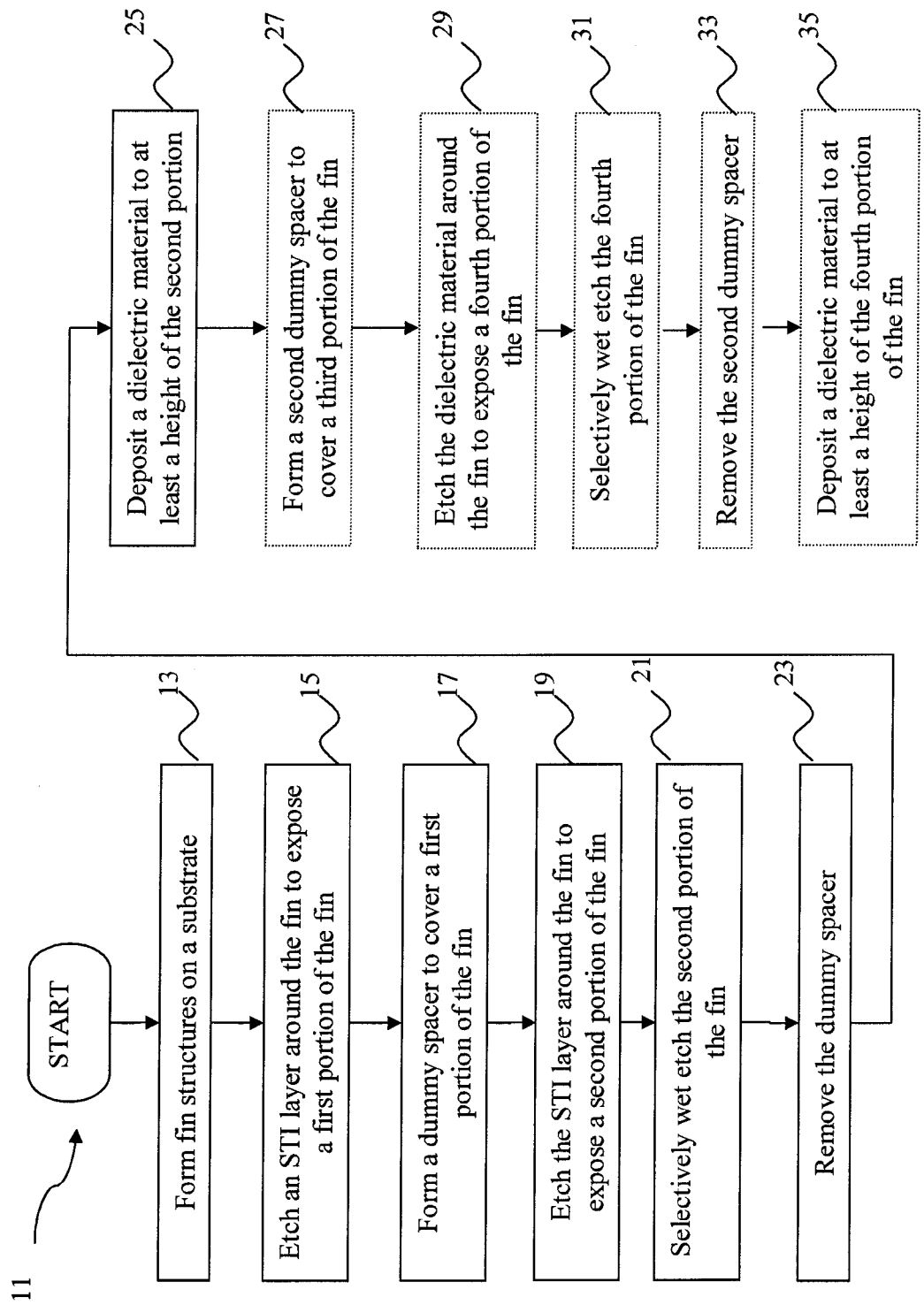
FIG. 2 illustrate a flowchart of a method for fabricating FinFET structures of FIGS. 1A and 1B.

FIG. 2 illustrate a flowchart of a method 11 for fabricating FinFET structures using TMAH according to some embodiments of the present invention. FIGS. 3 to 8 are cross-sectional views of FinFET structure at various stages of manufacture corresponding to some of the operations of process flow 11 of FIG. 2.

Referring to FIG. 2, fin structures are formed on a substrate in operation 13. As discussed above, the fin structures may be formed directly from a silicon substrate by etching trenches or be grown epitaxially from exposed silicon. Depending on the method used to form the fin, the area around the fin may be already or subsequently filled with a dielectric material as shallow trench isolation (STI). Typically, STI is deposited using a chemical vapor deposition (CVD) process.

Figure 3:
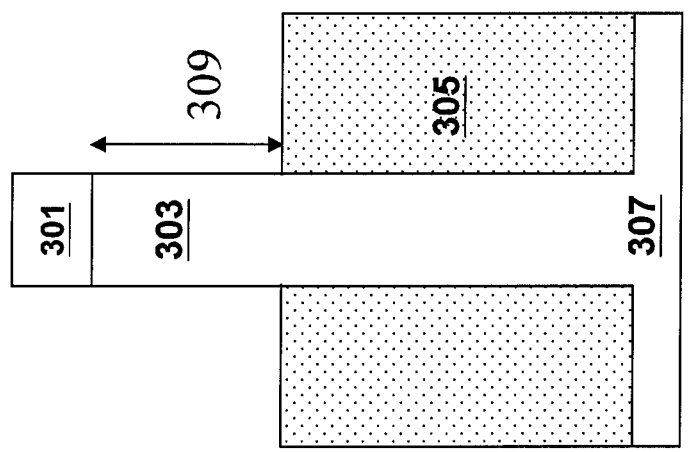

In operation 15, the STI layer around the fin is etched to expose a first portion of the fin using a dry etch process or a wet etch process. As discussed above, the fin may be formed with an STI layer around the fin or the STI layer may be deposited after the fin is formed. FIG. 3 illustrates the fin after this operation. The fin 303 is connected to bulk silicon 307 and includes an exposed portion having a height 309. A hardmask 301 is shown covering a top portion of the fin 303. In some embodiments, the hardmask 301 may be removed before this operation. The STI layer 305 surrounds a bottom portion of the fin 303 that is not exposed. While FIG. 3 shows a substantially rectangular fin with substantially equal widths at the top of the fin and at the bottom of the fin, in practice small variations in width may result from the specific etch process used to expose the fin. This disclosure envisions a more irregularly shaped fin as within the spirit and scope of the present invention.

Figure 4:
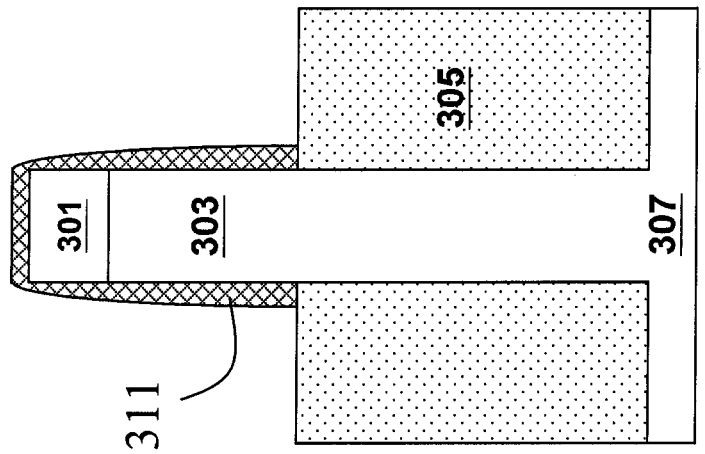
FIGS. 3 to 8 show various stages during fabrication of a FinFET structure on a substrate according to one or more embodiments of the present disclosure.

In operation 17 of FIG. 2, a dummy spacer is formed to cover the first portion of fin that was exposed in operation 15. FIG. 4 illustrates the fin 303 with the hardmask 301 and the first portion covered by dummy spacer 311. The spacer may be deposited using conventional CVD techniques and may be any material that is more resistant to etchants used in operation 21 than the fin material and etchants used in operation 19 than the STI layer. Etch resistant material usable for forming the dummy spacer includes certain types of silicon oxide, silicon nitride, photoresist, and other applicable materials. Note that etch resistance does not mean that the material is completely impervious to removal by etchant, but rather only in comparison to the material being etched. One skilled in the art would be able to deposit an appropriate amount of dummy spacer material to withstand the etching conditions of operations 19 and 21.

Figure 5:
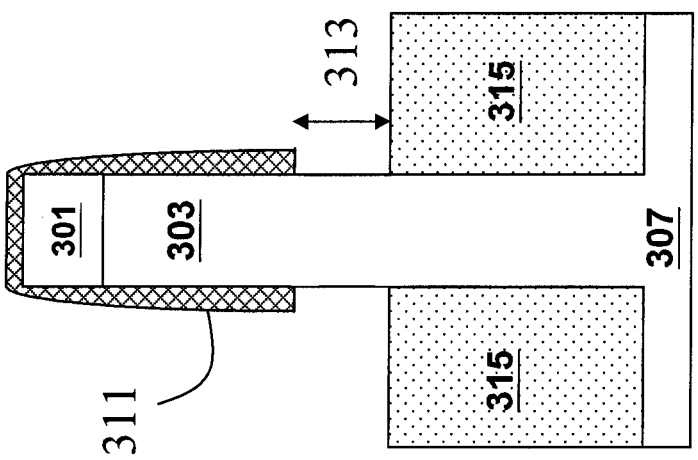

In operation 19 of FIG. 2, the STI layer around the fin is etched again to expose a second portion of the fin below the dummy spacer. This etch operation may be the same as that of operation 15. FIG. 5 illustrate a fin 303 having a second portion exposed according to operation 19 of FIG. 2. The STI layer 305 is thus etched to form an etched STI layer 315. The etch removes STI material preferentially over the dummy spacer 311 and the fin 303. An etch process that selectively removes more STI material over dummy spacer 311 or silicon material (the fin) includes dry etching using a reactive chemistry or by ion bombardment. The reactive chemistry may include a fluorine-based gas such as $CF_3$ or $CF_4$ with hydrogen or oxygen added. Other processes for etching STI material, usually silicon oxide, preferentially over silicon and dummy spacer material may be used.

The second portion of the fin has a height 313. The height 313 of the second portion is selected to form a desired notch or narrowing size. Depending on the final narrowest width desired, smaller or larger second portion height may be used. Generally, when the second portion height is larger, the notch formed would be bigger and therefore the narrowest width would be smaller when using an anisotropic selective orientation process. In some embodiments when some isotropic wet etch is used to narrow the second portion fin, the narrowest width does not depend on the second portion height, but rather the etch process conditions determine how much material is removed.

Figure 6:
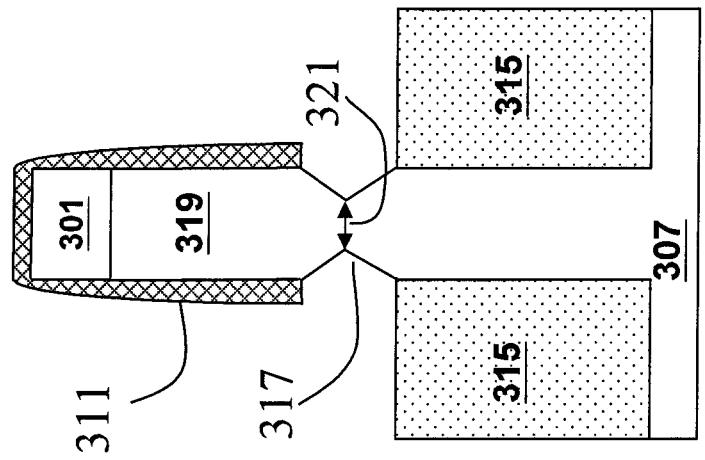

In operation 21 of FIG. 2, the second portion of the fin is selectively etched. FIG. 6 illustrates a fin 319 after having a second portion etched to form notch 317. The selective etch conditions for forming a notch and other shapes are described above and is not repeated here. The fin width at the deepest part of notch 317 is referred to as the narrowest width 321. Note that the narrowest width 321 is shown in FIG. 6 in a fin cross section. The narrowest width can vary along the length of the fin in different fin cross sections.

In some embodiments, the notch size may vary along the length of the fin by varying the height of the second portion. The height of the second portion may be larger toward the middle of the fin, causing the notch to be larger in the middle than at the distal ends of the fin. For example, the cross section in the middle of the fin can have a different narrowest width than the cross section at the ends of the fin. The differing second portion height may be achieved by having different sized gaps between the fins along the length of the fin. If the fins have a bow shape so that the distance between fins is larger in the middle, than the STI etch of operation 19 would remove more material and expose more of the fin. In other embodiments, the STI layer may be patterned before etching in operation 19 such that only one side of the second portion is etched. For example, the dummy spacer layer may cover a portion of the STI surface adjacent to one side of the fin. In those cases only one notch would be formed.

In some embodiments, a portion of the fin length may have notches on both sides while other portions of the fin length may have notch on only one side. For example, the notches may be on both sides in a middle region of the fin under the gates, causing the middle region to have smaller narrowest width as compared to the distal ends of the fin. In the middle region, in some embodiments, the fin is etched through and the notches from both sides of the fin connect with each other. Such structure would eliminate the channel punch-through effect. At the distal ends of the fin, the notches would be only one side of the fin and not go through so that the fin remains structurally supported by the bulk silicon layer. By controlling the height of the second portion and whether only one side of the second portion is etched, the narrowest width of the fin can be made to vary along the length of the fin according to the likelihood of channel punch-through effect for the FinFET design.

Figure 8:
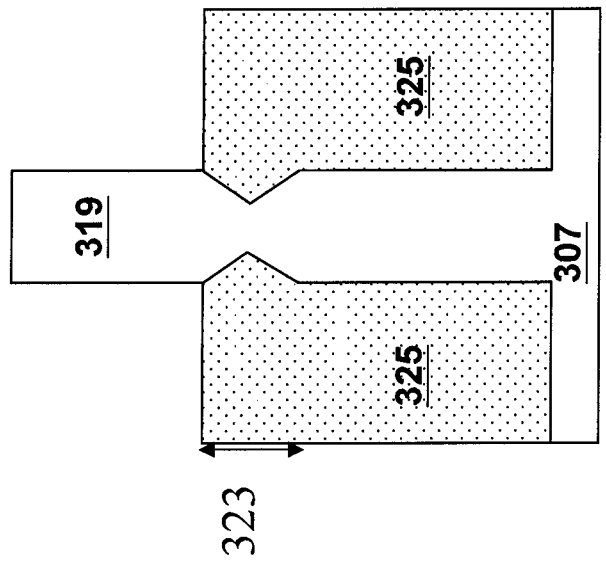
Figure 7:
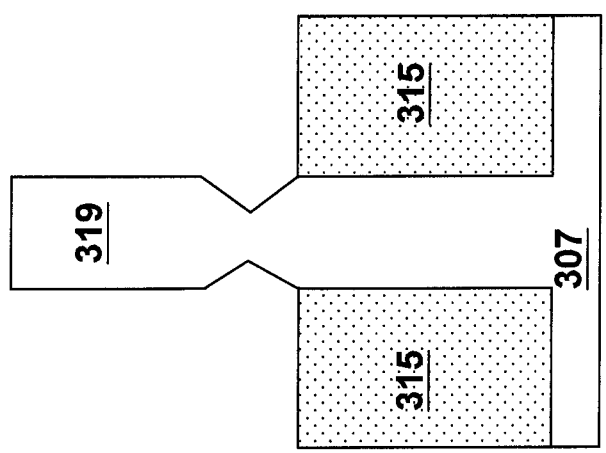

Referring back to FIG. 2, the dummy spacer and the hardmask, if not removed earlier, are removed in operation 23. FIG. 7 illustrates the structure after operation 23. In operation 25, a dielectric material is deposited at least to a height of the second portion. FIG. 8 illustrates the structure after operation 25. The additional dielectric material deposited over the etched STI layer 315 is shown having a thickness 323. Thickness 323 is equal to or greater than the second portion height 313. The top surface of the resulting STI layer 325 is higher than the notches so that the notches are completed covered. Depending on the dielectric deposition process used and the geometry of the narrowing, in some instances the narrowed region may not be completely filled, especially if the fin is etched through in some regions.

In certain embodiments, an additional narrowed region is formed on the fin. Optional operations 27 to 35 describe the process to form the additional narrowed region. The additional narrowed region is formed above the first narrowed region formed in operation 21. In operation 27, a second dummy spacer is formed to cover a third portion of the fin. The third portion is a fraction of the first portion described with respect to operation 15. Then the dielectric material around the fin is etched to expose a fourth portion of the fin in operation 29. The fourth portion may be entirely above the first narrowed region. As in operation 21, the fourth portion is selectively wet etched in operation 31 to form a narrowing shape, which may be a notch, a portion of a semi ellipsoid, or a rectangle. The various applicable etching methods are described above and not repeated here. After the fourth portion is wet etched, the second dummy spacer is removed in operation 33. Then a dielectric material is deposited to at least a height of the fourth portion of the fin in operation 35. The result is a structure as shown in FIG. 9.

In some embodiments, the fourth portion may include a part of the first narrowed region. In these embodiments the narrowed regions overlap and a variety of narrowing shapes may result as a previously wet etched portion is etched again.

Figure 9:
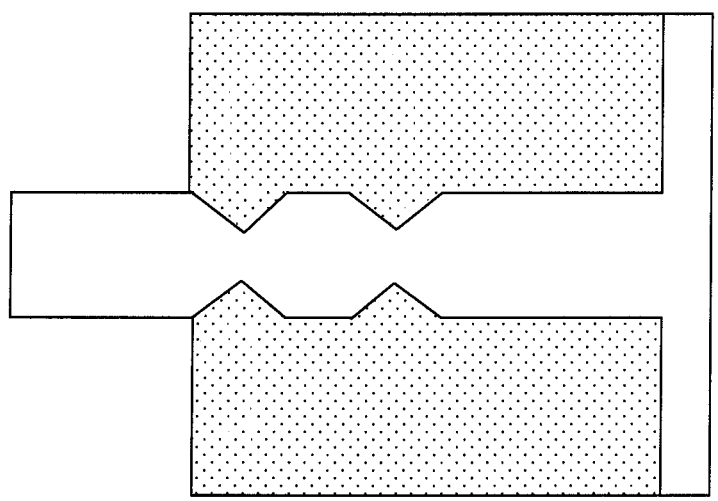
FIG. 9 illustrates a partially fabricated FinFET in accordance with another embodiment of the present disclosure.

FIG. 9 shows a structure having two sets of notches one above another. Note that the STI layer covers both sets of notches. When multiple narrowed regions are used, the narrowing shapes need not be the same. For example one set may be notches while the other set may be rectangles. Further, one set may be etched on one side of the fin while the other set may be etched on both sides of the fin.

After the fin is formed, the FinFET manufacture continues. The remaining FinFET forming process steps are described here to provide context for the present disclosure. A gate dielectric layer and gate electrode layer are deposited over the narrowed fins and the STI layer. Gate dielectric layer is formed of a high dielectric constant (high-k) dielectric material. The exemplary high-k materials may have k values greater than about 4.0, or even greater than about 7.0, and may include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. Gate electrode layer is formed on the gate dielectric layer, and may be formed of a conductive material such as doped polysilicon, metals, or metal nitrides.

The gate electrode layer and gate dielectric layer are then patterned to form gate stacks over a middle portion. The fin portions not under the gate stacks are then optionally doped to form lightly doped drain/source (LDD) regions. The dopant used depends on the conductivity type of the transistor. The LDD regions may be doped by ion-implanting or by plasma doping where dopants are deposited onto the fin and annealed. Source and drain regions are formed across the gate stack. Source and drain regions may be formed by ion-implanting a source/drain region or by removing a portion of the fin and epitaxially re-growing the removed portion under doping conditions to form a source/drain region. In many instances according to some embodiments, it may be beneficial to increase the area available for source/drain contacts by epitaxially growing source/drain material over the fins, with or without first removing a portion of the fins.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a semiconductor substrate;
   a fin field-effect transistor (FinFET) on the substrate, said fin having a notched portion and a bottom portion having a substantially constant width between the notched portion and the semiconductor substrate, wherein the notched portion has a width less than a width of the bottom portion; and,
   a shallow trench isolation (STI) layer covering and filling the notched portion of the notched fin, the notched portion having a surface along a (1-1-1) plane.

2. The apparatus of claim 1, wherein a narrowest portion of the fin at an edge of the notch has varying width along a lateral direction of the fin.

3. The apparatus of claim 2, wherein the varying width is smallest below a gate stack of the FinFET.

4. The apparatus of claim 3, wherein the narrowest portion of the fin below the gate stack of the FinFET has zero width.

5. The apparatus of claim 1, wherein the notched fin includes one or more lengthwise notches on each side of the notched fin.

6. An apparatus comprising:
   a semiconductor substrate;
   a fin field-effect transistor (FinFET) on the substrate, wherein FinFET comprises a fin comprising a first portion having a vertically varying width with a narrowest portion and a buried portion having a substantially constant width below the first portion, wherein the buried portion is between the first portion and the semiconductor substrate; and
   a shallow trench isolation (STI) layer covering and filling the narrowest portion of the fin and surrounding the buried portion of the fin, wherein the fin further comprises an exposed portion above the STI layer.

7. The apparatus of claim 6, wherein the narrowest portion of the fin has a width less than 70% of the constant width.

8. The apparatus of claim 6, wherein the narrowest portion of the fin has a width less than 50% of a widest portion of the first portion of the fin.

9. The apparatus of claim 6, wherein a portion of the narrowest portion of the fin has a width of zero.

10. The apparatus of claim 6, wherein the vertically varying width includes more than one narrowest portions.

11. The apparatus of claim 1, wherein the notched fin includes two notches on each side of the notched fin.

12. The apparatus of claim 1, wherein the notched portion is defined by at least two (1-1-1) planes of the notched fin.

13. The apparatus of claim 6, wherein the first portion having a surface along a (1-1-1) plane.

14. The apparatus of claim 6, wherein the narrowest portion has two faces being (1-1-1) planes.

15. A semiconductor device comprising:
   a substrate;
   a fin structure over the substrate, the fin structure comprising:
   an upper portion having a constant width;
   a bottom portion having the constant width; and
   a middle portion between the bottom portion and the upper portion, the middle portion having a vertically varying width less than the constant width, and the bottom portion between the middle portion and the substrate;
   a first dielectric layer surrounding sidewalls of the bottom portion of the fin structure and exposing the middle portion of the fin structure;
   a shallow trench isolation (STI) layer covering an entirety of the middle portion;

a second dielectric layer surrounding sidewalls of the upper portion of the fin structure and exposing the middle portion of the fin structure.

16. The semiconductor device of claim 15, wherein the middle portion comprising a notched portion defined therein.

17. The semiconductor device of claim 16, wherein the notched portion is defined by at least two (1-1-1) planes of the fin structure.

18. The semiconductor device of claim 16, wherein the middle portion comprising another notched portion defined therein.

19. The semiconductor device of claim 18, wherein the another notched portion is defined by at least two (1-1-1) planes of the fin structure.

20. The semiconductor device of claim 15, wherein the second dielectric layer has a material comprising silicon oxide or silicon nitride.

\* \* \* \* \*